(12) United States Patent
Piggott

(10) Patent No.: US 12,029,122 B2
(45) Date of Patent: Jul. 2, 2024

(54) METHOD FOR WIRELESS POWER TRANSFER USING THERMOELECTRIC GENERATORS

(71) Applicant: Applied Thermoelectric Solutions, LLC, Novi, MI (US)

(72) Inventor: Alfred J. Piggott, Novi, MI (US)

(73) Assignee: Applied Thermoelectric Solutions, LLC, Novi, MI (US)

(*) Notice: Subject to any disclaimer, the term of this patent is extended or adjusted under 35 U.S.C. 154(b) by 367 days.

(21) Appl. No.: 17/381,269

(22) Filed: Jul. 21, 2021

(65) Prior Publication Data

US 2021/0399188 A1    Dec. 23, 2021

Related U.S. Application Data

(62) Division of application No. 16/705,985, filed on Dec. 6, 2019, now Pat. No. 11,107,964.

(60) Provisional application No. 62/776,094, filed on Dec. 6, 2018.

(51) Int. Cl.
| | |
|---|---|
| *H10N 10/10* | (2023.01) |
| *H02J 50/00* | (2016.01) |
| *H10N 10/00* | (2023.01) |
| *H10N 10/81* | (2023.01) |

(52) U.S. Cl.
CPC .......... *H10N 10/10* (2023.02); *H02J 50/001* (2020.01); *H10N 10/00* (2023.02); *H10N 10/81* (2023.02)

(58) Field of Classification Search
CPC ........ H10N 10/10; H10N 10/00; H10N 10/81; H02J 50/001
See application file for complete search history.

(56) References Cited

U.S. PATENT DOCUMENTS

| | | | |
|---|---|---|---|
| 3,757,146 | A | 9/1973 | Love |
| 4,213,292 | A | 7/1980 | Dolezal et al. |
| 5,419,780 | A | 5/1995 | Suski |
| 6,412,604 | B1 | 7/2002 | Schuster |
| 6,625,990 | B2 | 9/2003 | Bell |

(Continued)

FOREIGN PATENT DOCUMENTS

| | | |
|---|---|---|
| CN | 206703855 U | 12/2017 |
| JP | 2016079859 A | 5/2016 |

(Continued)

OTHER PUBLICATIONS

KR 20160100573 A, Machine Translation, Kim (Year: 2016).*

(Continued)

*Primary Examiner* — Devina Pillay
(74) *Attorney, Agent, or Firm* — Blanchard Horton PLLC

(57) ABSTRACT

A TEG system is attached to a rotating shaft and generates electricity from radiant energy that is substantially radiatively transmitted through the atmosphere from a stationary source to the TEG system that is rotating with the shaft. The rotation of the shaft provides cooling to the TEG system, but not heat energy. The TEG system includes at least one TEG, each TEG equipped with an energy receiving and heat containment window and an energy conversion system in combination with controlled convection cooling enhanced by an airflow moving in response to the rotation of the rotating shaft. Individual TEGs having controlled convection cooling also are described.

32 Claims, 7 Drawing Sheets

(56) References Cited

U.S. PATENT DOCUMENTS

| | | |
|---|---|---|
| 8,445,772 B2 | 5/2013 | Bell |
| 8,752,784 B2 | 6/2014 | Jolly et al. |
| 2009/0034202 A1 | 2/2009 | Chiu et al. |
| 2011/0265837 A1 | 11/2011 | Rasmussen et al. |
| 2015/0083179 A1* | 3/2015 | Bartl ............ H10N 10/10 |
| | | 136/205 |
| 2015/0357692 A1 | 12/2015 | Piggott et al. |
| 2016/0181499 A1 | 6/2016 | Denis et al. |
| 2018/0320938 A1 | 11/2018 | Otey et al. |
| 2019/0252745 A1 | 8/2019 | Piggott et al. |
| 2020/0185585 A1 | 6/2020 | Piggot |

FOREIGN PATENT DOCUMENTS

| | | | |
|---|---|---|---|
| KR | 20160100573 A | * | 8/2016 |
| WO | 2019130929 A1 | | 7/2019 |

OTHER PUBLICATIONS

"International Search Report and Written Opinion received for PCT Patent Application No. PCT/US2020/014322, mailed on Jun. 12, 2020", 11 Pages.

Lubieniecki, et al., "Integration of Thermal Energy Harvesting in Semi-Active Piezoelectric Shunt-Damping Systems", Journal of Electronic Materials, 44(1), 2015, 341-347.

Wang, et al., "Development of Thermolectric Generator used on 1800 RPM Rotating Shaft for Predictive Maintenance of Machinery", Available Online at: <<http://cap.ee.ic.ac.uk/pdm97/powermems/2011/Oral/3A-4.pdf>>, Nov. 2011, 4 Pages.

\* cited by examiner

METHOD FOR WIRELESS POWER TRANSFER USING THERMOELECTRIC GENERATORS

REFERENCE TO RELATED APPLICATIONS

This application is a division of U.S. Nonprovisional application Ser. No. 16/705,985, filed Dec. 6, 2019, entitled "System and Method for Wireless Power Transfer Using Thermoelectric Generators," which claims the benefit of U.S. Provisional Application No. 62/776,094 entitled "System and Method for Wireless Power Transfer Using Thermoelectric Generators" filed Dec. 6, 2018, both of which are incorporated by reference in the entirety.

BACKGROUND

Hydroelectric turbines play a key role in energy, water, and food security. Hydropower is the largest renewable energy source and produces around 16% of the world's electricity. To improve availability, reliability and lower energy costs, hydroelectric turbine rotating shafts are fitted with monitoring instruments that record data. This data enables turbine failures to be predicted with more accuracy and allows the turbine to stay in service much longer than it could without the data. This active monitoring of the localized temperatures, vibration, and other parameters of shaft rotation coupled with preventative maintenance in response to the collected shaft data reduces the incidence of unneeded, very expensive maintenance and the associated downtime.

To have sensors attached to the rotating shaft, the sensors require electrical power. Conventionally, such power is provided to the shaft by stationary electrical contacts that mechanically connect the rotating shaft to electrical terminals or by batteries residing on the shaft that must be recharged when the shaft is not rotating. However, as with a brushed motor, the electrical contacts wear out over time due to friction and require replacement. Thus, electrical contact replacement intervals can be lengthened by the added complexity of the batteries, but not eliminated. The batteries themselves also require replacement. Neither can inductive charging systems be used to transfer electricity to the rotating shaft as the shaft is made of steel or similar metal.

A Thermoelectric Generator ("TEG") takes advantage of the Seebeck Effect to turn heat directly into electrical energy. TEGs begin generating measurable current when a temperature gradient between the two sides of the device exists. The temperature difference acts, at an atomic level, to cause charge-carrying elements of the materials to build up on the cold side of the semiconductors. This buildup of charge carriers create an electrical voltage potential difference across the semiconductor couples. This voltage potential is directly proportional to the temperature difference across the semiconductor.

To create a TEG module, many p-type and n-type couples are connected electrically in series and/or parallel to create the desired electrical current and voltage. The couples generally are placed between parallel electrically insulating and thermally conductive plates. The plates provide structural rigidity, a flat surface for mounting and a dielectric layer to prevent electrical short circuits. One of the electrically insulating and thermally conductive plates is required to be "hot", while the other electrically insulating and thermally conductive plate is required to be relatively "cold". This is the temperature difference that creates the previously mentioned voltage potential.

As can be seen from the above description, there is an ongoing need for simple and efficient devices and methods for wirelessly generating electricity on a continuously rotating shaft. The systems and methods of present invention overcome at least one of the disadvantages associated with conventional devices.

SUMMARY

In one aspect, the invention provides a thermoelectric generation system for generating electricity from radiatively transmitted energy on a rotating shaft, the system including at least one thermoelectric generator attached to a rotating shaft and configured to generate electricity from a temperature difference in response to radiatively transmitted energy, where the at least one thermoelectric generator includes an energy receiving and heat containment window, where the energy receiving and heat containment window comprises an outer plate and an inner heat transfer plate which form an interior space between the outer plate and the inner heat transfer plate; an energy conversion system in conductive thermal communication with the energy receiving and heat containment window; a heat dissipation heatsink in conductive thermal communication with the energy conversion system; a controlled convection cooling system in convection thermal communication with the heat dissipation heatsink; where the energy conversion system is configured to generate electricity from a temperature differential between the energy receiving and heat containment window and the controlled convection cooling system; and where the controlled convection cooling system is configured to cool the heat dissipation heatsink when the rotating shaft is stationary and when the rotating shaft is rotating.

In another aspect of the invention, a thermoelectric generator for generating electricity from radiatively transmitted energy on a rotating shaft is described. The generator includes an energy receiving and heat containment window, where the energy receiving and heat containment window comprises an outer plate and an inner heat transfer plate which form an interior space between the outer plate and the inner heat transfer plate; an energy conversion system in conductive thermal communication with the energy receiving and heat containment window; a heat dissipation heatsink in conductive thermal communication with the energy conversion system; a controlled convection cooling system in convection thermal communication with the heat dissipation heatsink; where the energy conversion system is configured to generate electricity from a temperature differential between the energy receiving and heat containment window and the controlled convection cooling system; where the controlled convection cooling system is configured to cool the heat dissipation heatsink in the absence of a high velocity airflow and in response to the high velocity airflow; and where an exterior housing comprising a face plate encases the energy receiving and heat containment window, the energy conversion system, and the heat dissipation heatsink.

In another aspect of the invention, a method of converting radiatively transmitted energy to electricity on a rotating shaft with a thermoelectric generation system is described. The method includes activating a controlled external radiant source in response to rotation of a rotating shaft; generating electricity on the rotating shaft from at least one thermoelectric generator affixed to the rotating shaft; cooling the at least one thermoelectric generator through convection with a high velocity airstream, the high velocity airstream generated in response to rotation of the rotating shaft; and electrically powering one or more sensors on the rotating shaft during rotation of the rotating shaft with the electricity generated from the at least one thermoelectric generator.

Other systems, methods, features and advantages of the invention will be, or will become, apparent to one with skill in the art upon examination of the following figures and detailed description. It is intended that all such additional systems, methods, features, and advantages be included within this description, be within the scope of the invention, and be protected by the claims that follow. The scope of the present invention is defined solely by the appended claims and is not affected by the statements within this summary.

BRIEF DESCRIPTION OF THE FIGURES

The invention can be better understood with reference to the following drawings and description. The components in the figures are not necessarily to scale, emphasis instead being placed upon illustrating the principles of the invention.

DETAILED DESCRIPTION

A TEG system is attached to a rotating shaft and generates electricity from radiant energy that is substantially radiatively transmitted through the atmosphere from a stationary source to the TEG system that is rotating with the shaft. The rotation of the shaft provides cooling to the TEG system, but not heat energy. The TEG system includes at least one TEG, each TEG equipped with an energy receiving and heat containment window and an energy conversion system in combination with controlled convection cooling enhanced by an airflow moving in response to the rotation of the rotating shaft. Individual TEGs having controlled convection cooling also are described.

Unlike conventional devices that obtain "waste" heat from a rotating shaft though conduction, the described TEG system obtains substantially all the heat used to generate electricity from radiation through the atmosphere in response to a controlled external source. As the controlled external source radiates through the atmosphere, an insignificant amount of convection heating of the TEG system also occurs.

Figure 1:
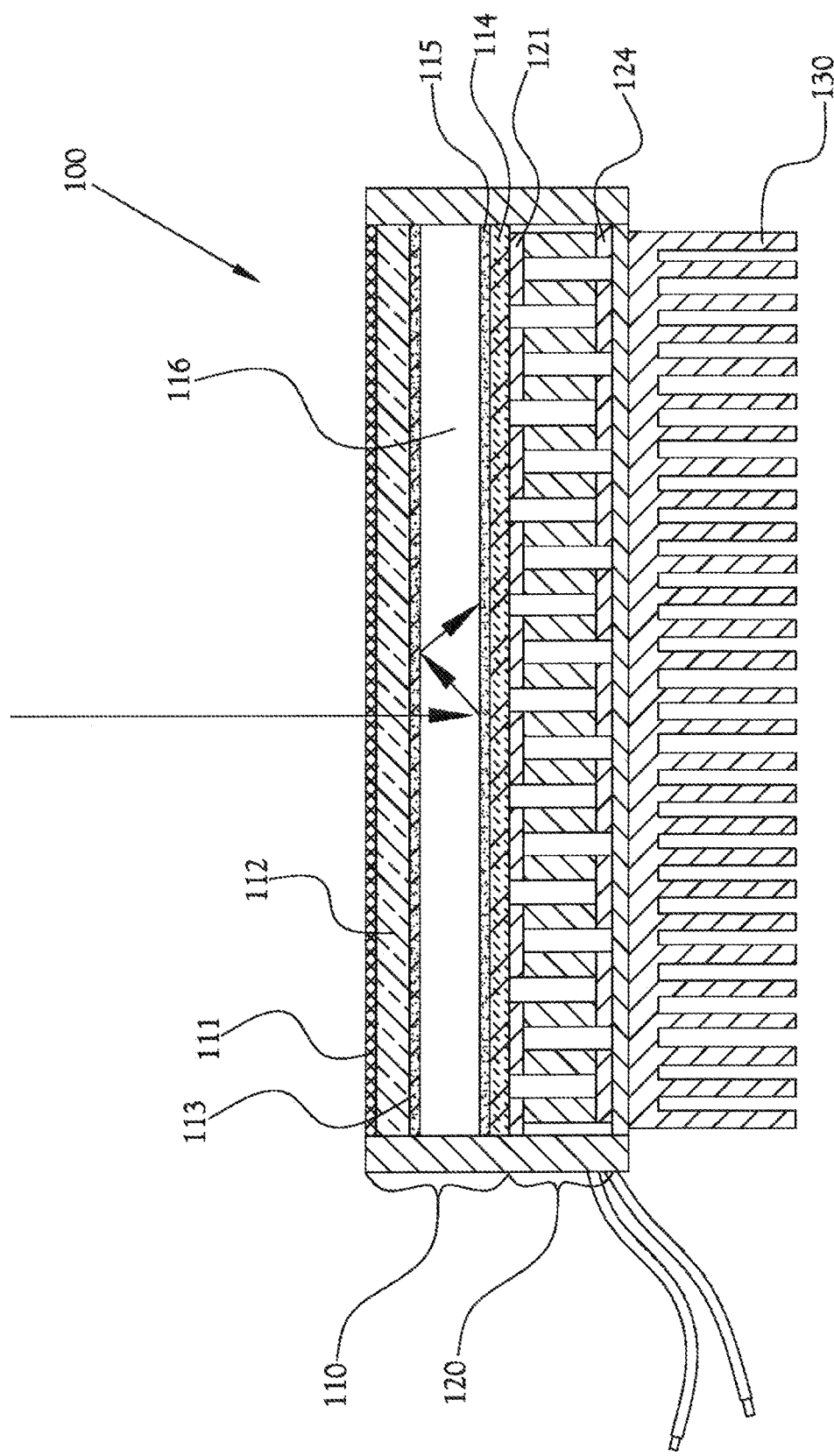
FIG. 1 represents a cross-section of a single TEG.

FIG. 1 represents a cross-section of a single TEG 100. The generator 100 includes an energy receiving and heat containment window 110, an energy conversion system 120, and a heat dissipation heatsink 130.

The energy receiving and heat containment window 110 includes an outer plate of high transmissivity glass 112 and an inner heat transfer plate 114 that preferably contains a vacuum within an interior space 116. While less preferred, the vacuum may be replaced with an inert gas or air. Preferably, a rubber like gasket (not shown) is used between the outer plate 112 and the inner heat transfer plate 114 to provide the ability to hold a vacuum. A top face 111 of the outer glass plate 112 is exposed to the atmosphere and coated with an anti-reflective coating to prevent radiant energy (RE) striking the top face 111 from being reflected away from the energy receiving and heat containment window 110, and thus lost. A bottom face 113 of the outer plate 112 is exposed to the interior space 116 and is preferably coated with a reflective coating so that RE striking the bottom face 113 is redirected to the inner heat transfer plate 114. A top interior face 115 of the inner heat transfer plate 114 is coated with a high emissivity coating to enhance adsorption of the RE.

Preferably, the outer plate 112 and the inner heat transfer plate 114 are not in conductive thermal communication. In this way, the energy receiving and heat containment window 110 creates a "thermal diode" that is optimized to trap RE and heat the inner heat transfer plate 114. Without the interior space 116, associated interior coatings of the outer plate 112 and the inner heat transfer plate 114, and the conductive heat transfer isolation between the outer plate 112 and the inner heat transfer plate 114, the high velocity air passing the TEG 100 during rotation of the rotating shaft would undesirably cool the inner heat transfer plate 114, thus reducing electricity generation.

The outer plate of high transmissivity glass 112 preferably is made from glass optimized for passage of RE, including light wavelengths in the infrared (IR) range. Preferable glasses include glass including germanium glass, potassium bromide glass, sodium chloride glass, magnesium fluoride glass, calcium fluoride glass, zinc sulfide glass, zinc selenide glass, sapphire glass, and combinations thereof.

The inner heat transfer plate 114 is electrically insulating and thermally conductive. The heat transfer plate 114 may be a composite including ceramic, metallic, and/or polymeric materials that electrically insulates the semiconductor units of the energy conversion system 120, but conducts heat from the interior space 116 to the energy conversion system 120. The heat transfer plate 114 may be a layered structure, such as a polymeric coated metal plate where the polymer coating provides the electrical insulation between the semiconductor units while the metal provides the thermal conductivity.

The anti-reflective coating coated onto the top face 111 of the outer glass plate 112 may include dye-based and laser-deposited anti-reflective coatings. Preferable anti-reflective dye-based coatings include the near IR wavelength absorbing dyes available from Epolin, Newark, NJ under the SPECTRE™ brand name. Preferable anti-reflective laser-deposited coatings include the laser-deposited broadband antireflective coatings, such as the YAG-BBAR coatings available from Thorlabs, Newton, NJ.

The reflective coating coated onto the bottom face 113 of the outer glass plate 112 may include metal-based reflective coatings, such as those including nobelium, actinium, silver, copper, gold, tin dioxide, silicon dioxide, and combinations thereof.

The high emissivity coating on the top interior face 115 of the inner heat transfer plate 114 is preferably metal-based. Metal-based high emissivity coatings include lead sulfide, nickel chromium oxides, nickel and zinc sulfides, nickel tin, germanium silicon lead sulfide, silver, and the like. The high emissivity coating also may not be metal-based, such as when thickness-sensitive spectrally selective coatings are used. Any high emissivity coating may be used on the top interior face 115 of the inner heat transfer plate 114 that assists in radiant energy heating the inner heat transfer plate 114 that is compatible with the material from which the inner heat transfer plate 114 is formed.

The energy conversion system 120 includes semiconductor materials that directly create an electric potential in response to a temperature difference. The semiconductor materials generally have an alternating N- and P-type orientation. Suitable semiconductor materials include bismuth telluride, lead telluride, silicon germanium, and the like. A top side 121 of the energy conversion system 120 contacts the inner heat transfer plate 114, and thus increases in temperature when RE enters the energy receiving and heat containment window 110 and heats the inner heat transfer plate 114.

A bottom side 124 of the energy conversion system 120 contacts the heat dissipation heatsink 130, which becomes relatively cool during operation in response to controlled convection cooling. The heat dissipation heatsink 130 is preferably made from metal, more preferably a metal such as aluminum that is capable of quickly transferring heat. While not shown in the figures a portion of the heat dissipation heatsink 130 that is represented as solid metal may include channels filled with a solid material that undergoes a phase change to a liquid upon heating. The solid to liquid phase change of this material may provide a relatively high heat capacity to the heat dissipation heatsink 130 before the controlled convection cooling begins. The figure represents the heat dissipation heatsink 130 with open spaces or "cooling fins" that allow controlled direct convection cooling of the heat dissipation heatsink 130; however, such cooling fins are not required in the event the heat dissipation heatsink 130 includes a liquid that transfers heat to another location for convection cooling. In this instance, heat dissipation heatsink 130 is substantially cooled by controlled indirect convection cooling.

In this manner, the TEG 100 has a hot side including the energy receiving and heat containment window 110 and a cold side including the heat dissipation heatsink 130, with the energy conversion system 120 in conductive thermal communication with both the hot side and the cold side. In relation to some conventional devices, the energy conversion system 120 is not required to be under vacuum, as the energy receiving and heat containment window 110, which preferably encases a vacuum, coa)nductively transfers heat to the energy conversion system 120.

The outer plate of high transmissivity glass 112 may include one or more internal passageway drilled substantially parallel through the glass to allow air cooling of the outer plate 112. These internal passageways through the glass may be in air communication with holes drilled or formed in the face of the plate that holds the energy receiving and heat containment window 110 in place, as will be discussed further below. As the generator 100 is configured to rotate at high speed on the rotating shaft, a portion of the space between the energy receiving and heat containment window 110, the energy conversion system 120, and/or the heat dissipation heatsink 130 may be filled or partially filled with reinforcing material (not shown) such as epoxy or a composite including epoxy and a filler such as glass microbeads and the like. Preferably, the reinforcing material may surround or partially surround the energy conversion system 120, thus providing a top and bottom rigid surface for clamping the inner heat transfer plate 114 and the heat dissipation heatsink 130 to, respectively. The rotating shaft to which the generator 100 is affixed exposes the generator 100 to sustained g-forces in excess of 200 g.

Figure 2:
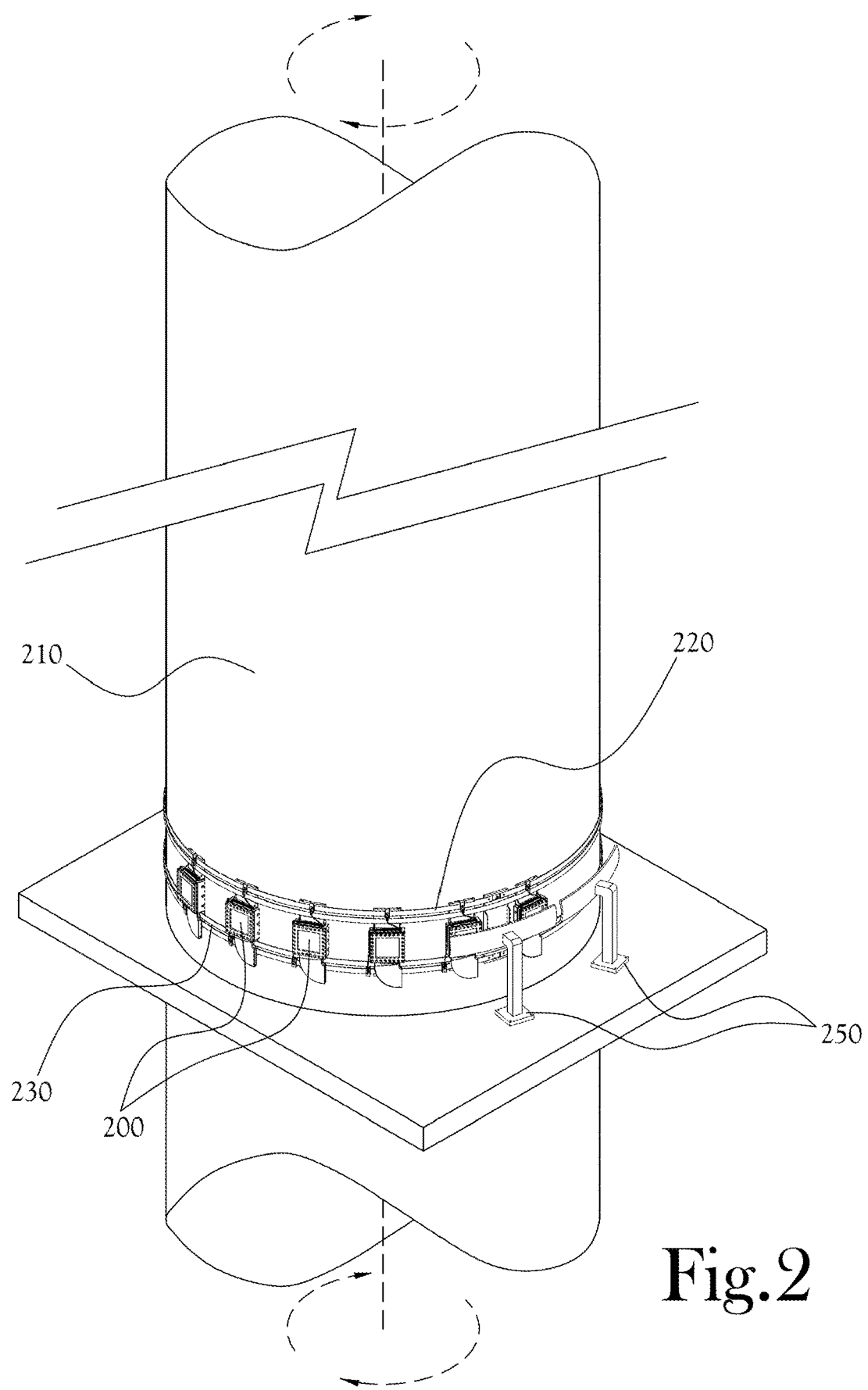
FIG. 2 represents multiple TEGs attached to a rotating shaft.

FIG. 2 represents multiple TEGs 200 attached to a rotating shaft 210. The multiple TEGs 200 are electrically connected with a positive polarity rail 220 and a negative polarity rail 230, thus providing an electric potential on the shaft that is accessible to drive the desired sensors and other electronics. Controlled external radiant sources 250 provide the RE to the multiple TEGs 200 when an electric potential is desired at the shaft. Thus, the ability of the multiple TEGs to generate electricity is determined by the radiant intensity of the heat sources 250 and the temperature difference between the hot and cold sides of the TEGs.

Suitable heat sources 250 include, but are not limited to laser beam(s), infrared heater(s), flame(s) from burner(s), concentrated solar energy, ceramic heaters, carbon heaters, quartz lamps, or other radiant energy sources that can be focused toward the energy receiving and heat containment windows of the TEGs 200. The heat sources 250 transfer heat to the TEGs 200 by radiative means. One or more heat sources 250 may be used. When more than one heat source 250 is used, the heat sources may be of different types. Additional heat sources 250 may be used to increase the power output of the TEGs 200, thus the number of heat sources 250 may be increased, decreased, or varied in heat output to throttle the power output. The heat output from the heat sources 250 may be concentrated toward the energy receiving and heat containment windows of the TEGs 200 to increase efficiency of power generation. Concentration may be accomplished with a parabolic collector, frenal lens, and the like. The heat sources 250 may be stationary or may track the rotating TEGs 200 and may be equipped with activation/deactivation sensors (not shown) in electrical communication with one or more processors (not shown) that govern TEG operation and that of the associated heat sources 250.

Activation/deactivation sensors may provide electrical outputs responsive to velocity, revolutions-per-minute of the rotating shaft, ambient temperature, TEG hot side temperature, TEG cold side temperature, electrical condition, electrical load, and the like. While the sensors provide electrical outputs, the outputs may be in response to optical signals, radio waves, and the like. The sensors may be used so the processor can signal the heat sources 250 to adjust the heat flux up or down or turn some or all of the heat sources 250 on and off. For example, if the heat sources 250 are infrared ceramic heaters that use natural gas, the gas flow rate may be adjusted by the processor. Alternatively, if the heat sources 250 are lasers, the lasers may be switched on and off fast enough that the laser beam only strikes the energy receiving and heat containment windows of the rotating TEGs 200 in response to velocity, RPM, and rotating shaft position sensors. The sensors also may allow the processor to operate the TEGs 200 efficiently, such as by connection and disconnection relays.

Figure 3A:
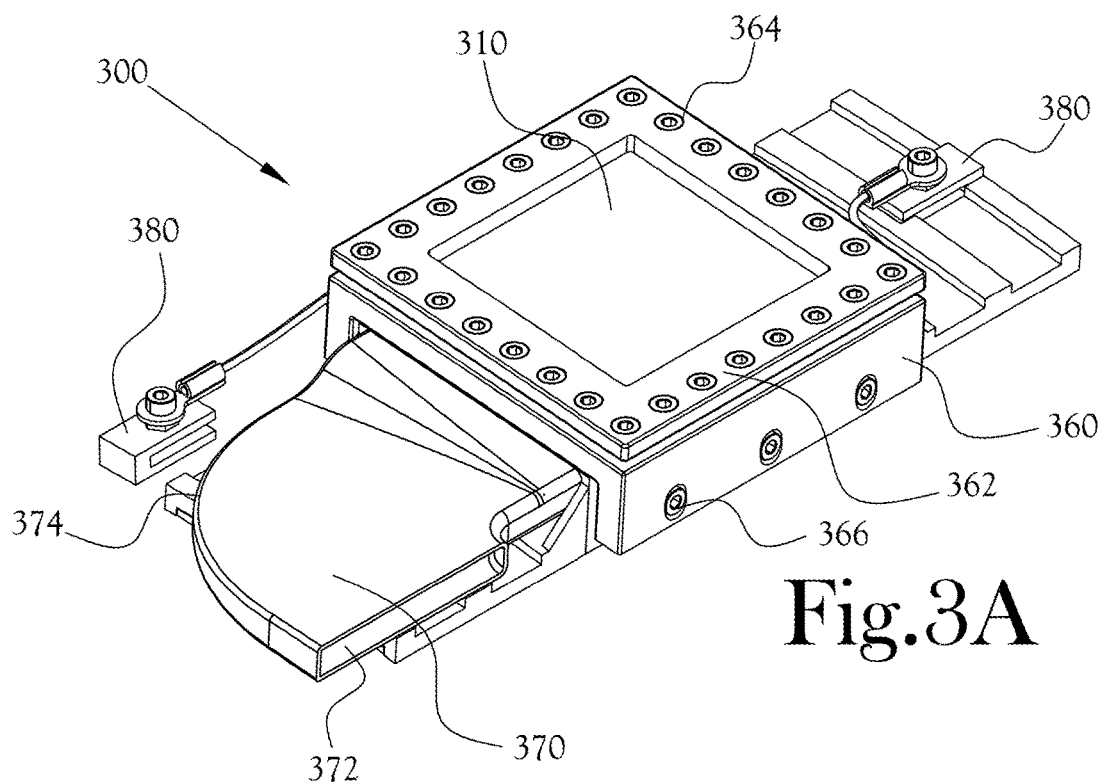
FIG. 3A and FIG. 3B represent and air-cooled TEG.
Figure 3B:
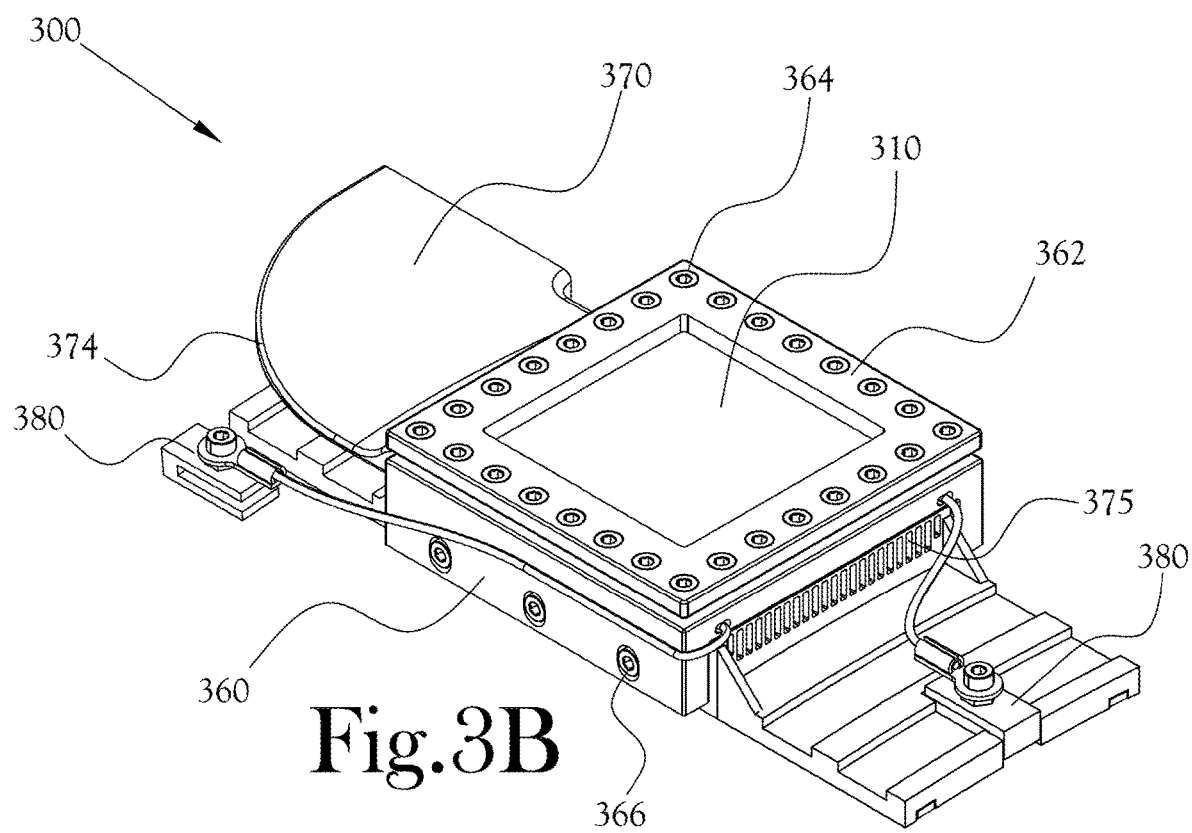

FIG. 3A and FIG. 3B represent an air-cooled TEG 300. The generator 300 is configured for attachment to a rotating shaft, but could be used independently of the shaft if placed in a suitable airflow.

The generator 300 includes an energy receiving and heat containment window 310, an energy conversion system (not visible), and a heat dissipation heatsink (not visible) as previously described. An exterior housing 360 encases the energy receiving and heat containment window 310, the energy conversion system, and the heat dissipation heatsink. The heat dissipation heatsink preferably forms the bottom side of the exterior housing 360. The heat dissipation heatsink may be equipped with a magnet which permits permanent or intermittent connection to the rotating shaft.

The exterior housing 360 includes face plate 362 that holds the energy receiving and heat containment window 310 in place. While not required, a high-temperature compatible O-ring may be used between the face plate 362 and the outer plate of the energy receiving and heat containment window 310 to prevent breakage of the outer plate of the energy receiving and heat containment window 310. The face plate 362 may be equipped with holes 364 that allow air to circulate around the energy receiving and heat containment window 310. The sides of the exterior housing 360 may be equipped with side holes 366 that allow air to pass through the face plate holes 364. Thus, the exterior housing 360 may include holes that provide for air to circulate and holes through which bolts or other attachment means may pass to hold the exterior housing 360 together. The face plate 362 also may include holes in the face and sides (not shown) that allow for air to circulate across the top of the energy receiving and heat containment window 310.

As previously described, if the outer plate of high transmissivity glass includes internal passageways (not shown) drilled parallel through the glass to allow air cooling of the outer plate, the air moving through the face plate holes 364 and/or the side holes 366 may be directed through the passageways to enhance cooling of the outer plate of high transmissivity glass. In addition to holding the energy receiving and heat containment window 310 in place, the face plate 362 also may be configured to serve to block undesirable convective cooling of the energy receiving and heat containment window 310. The surface of the face plate 362 also may be polished to create a high emissivity surface to reflect heat from heating the face plate 362.

The generator 300 includes positive and negative electrical attachment contacts 380 that establish electrical communication with the positive and negative polarity rails. While wires, eyelets, and clips are shown, any collection of mechanical parts may be used to establish electrical communication between the generator 300 and the positive and negative polarity rails.

The generator 300 includes a means for introducing high velocity air into the generator 300 in the form of an induction funnel 370 that is configured to force the high velocity air into the exterior housing 360 and thus past the heat dissipation heatsink to directly convection cool the heat dissipation heatsink. Thus, the induction funnel 370 provides controlled direct convection cooling to the generator 300 during use.

A high velocity airstream, which moves at speeds from 100 kilometers per hour up to or in excess of approximately 650 kilometers per hour, is generated as the rotating shaft rotates. In view of this use, the induction funnel 370 preferably is significantly less wide than it is tall to introduce maximum high velocity air into the exterior housing 360 while not being torn from the exterior housing 360 due to the pressures generated by the high velocity air. Preferably, the induction funnel 370 has a height dimension that is at least four times a width dimension. Preferably, the induction funnel 370 also includes a tapered or rounded side 374 opposite air inlet 372, which substantially reduces air turbulence on the outside of the funnel 370 and the exterior housing 360. Such reduced turbulence provides enhanced direct convection cooling of the fins of the heat dissipation heatsink, reduces the likelihood that the high velocity air entering the device will damage the internal components or tear portions of the device from the rotating shaft, and reduces the noise made by the high velocity air rushing through the generator 300. When multiple generators 300 are used on a rotating shaft, the funnel 370 also may be configured to decrease the air turbulence proximate to the rotating shaft during rotation so the second generator passing through the air proximate to the rotating shaft does not enter turbulent air created by the first generator.

The exterior housing 360 includes opening vents 375 on the opposite side to which the induction funnel 370 is attached to allow the high velocity air to exit the exterior housing 360 after passing the heat dissipation heatsink while the rotating shaft is in motion. This orientation of the induction funnel 370 on the lower side and the opening vents 375 on the upper side of the exterior housing 360 allow for direct convection cooling when the rotating shaft is stationary, as heat naturally rises, and reduces the incidence of heated air flowing out through the opening vents 375 on the upper side of the exterior housing 360 from being drawn back into the induction funnel 370 when the rotating shaft is rotating. Thus, in use, the generator 300 is primarily cooled through controlled direct convection by the high velocity air introduced through the induction funnel 370 moving past the heat dissipation heatsink.

While not required, the contact between the generator 300 and the rotating shaft may be configured to allow heat from the exterior housing 360 to transfer by conduction into the rotating shaft. This conduction heat rejection pathway from the exterior housing 360 into the rotating shaft is the opposite to how many conventional "waste heat" recovery thermoelectric generators operate, where the heat they use to generate electricity is primarily provided through conduction.

Figure 4A:
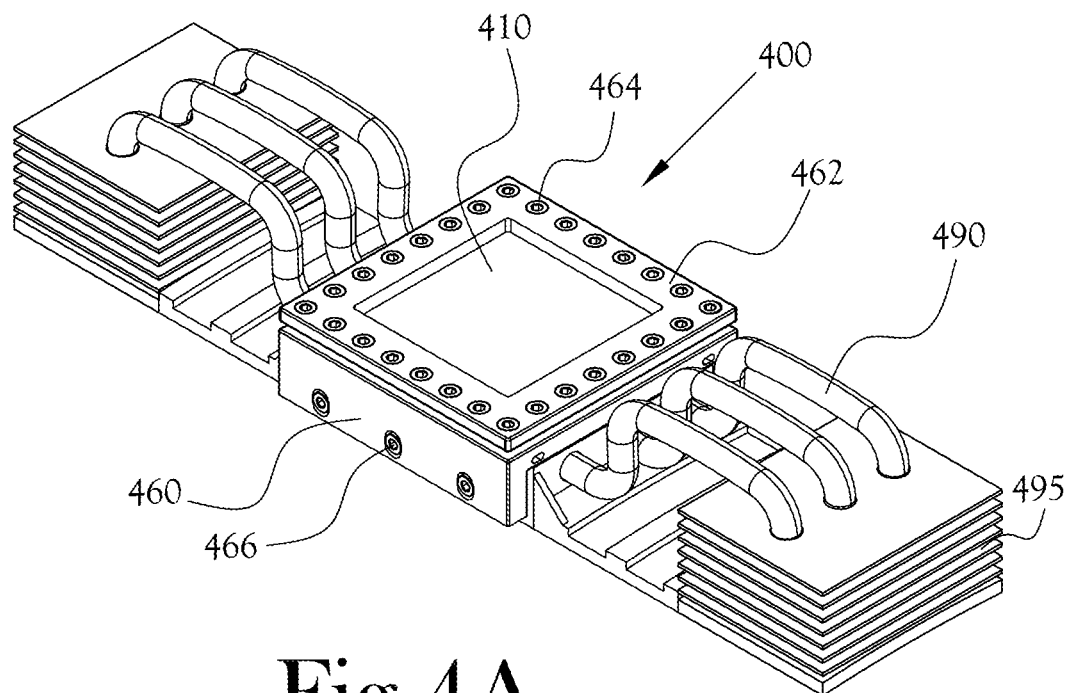
FIG. 4A and FIG. 4B represent a heat pipe, thus liquid and air-cooled TEG.
Figure 4B:
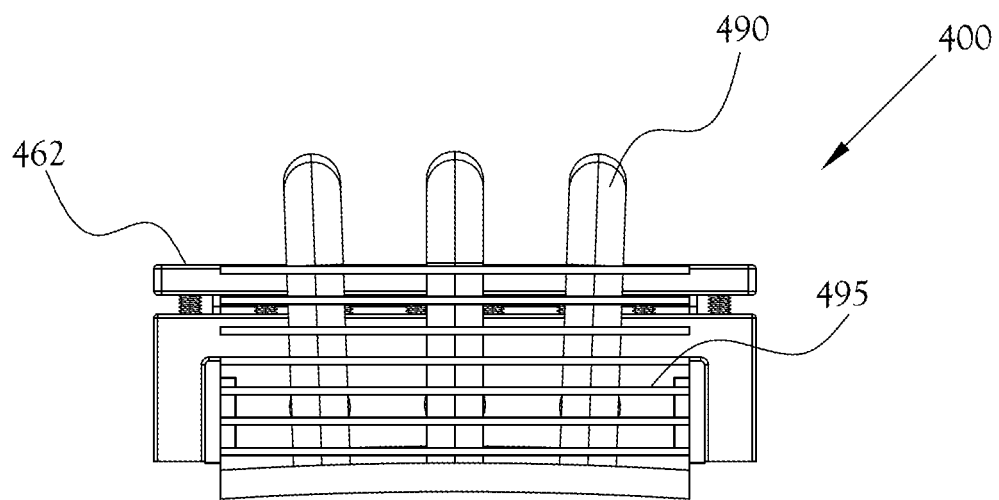

FIG. 4A and FIG. 4B represent a heat pipe, thus liquid and air cooled TEG 400. The generator 400 is configured for attachment to a rotating shaft, but could be used independently of the shaft if placed in a suitable airflow.

The generator 400 includes an energy receiving and heat containment window 410, an energy conversion system (not visible), and a heat dissipation heatsink (not visible) as previously described. An exterior housing 460 encases the energy receiving and heat containment window 410, the energy conversion system, and the heat dissipation heatsink. The heatsink preferably forms the bottom side of the exterior housing 460. The heatsink may be equipped with a magnet which permits permanent or intermittent connection to the rotating shaft.

The exterior housing 460 includes face plate 462 that holds the energy receiving and heat containment window 410 in place. While not required, a high-temperature compatible O-ring may be used between the face plate 462 and the energy receiving and heat containment window 410. The face plate 462 may be equipped with holes 464 that allow air to circulate around the energy receiving and heat containment window 410. The sides of the exterior housing 460 also may be equipped with side holes 466 that allow air to pass through the face plate holes 464. As previously described, if the outer plate of high transmissivity glass includes one or more internal passageway (not shown) drilled through the glass to allow air cooling of the outer plate, the air moving through the face plate holes 464 and/or the side holes 466 may be directed through the passageways to enhance cooling of the outer plate of high transmissivity glass. In addition to holding the energy receiving and heat containment window 410 in place the face plate 462 also may be configured to serve to block undesirable convective cooling of the energy receiving and heat containment window 410. The surface of the face plate 462 also may be polished to create a high emissivity surface to reflect heat from heating the face plate 462. The generator 400 includes positive and negative electrical attachment contacts (not shown) that establish electrical communication with the positive and negative polarity rails.

Unlike the generator 300, the generator 400 transfers heat from the heat dissipation heatsink to a liquid, which is then transferred through heat pipes 490 into an exterior heatsink 495. Thus, the heat pipes 490 and the exterior heatsink 495 in combination provide controlled indirect convention cooling to the generator 400 during use as the convection cooling substantially occurs at the exterior heatsink 495. While the generator 400 is represented with two sets of heat pipes 490 and exterior heatsinks 495, a single set of heat pipes 490 with a single exterior heatsink 495 may be used. The high velocity airstream generated by the rotating shaft thus passes over and/or through the exterior heatsinks 495. While not required, the heat dissipation heatsink is preferably configured to contain a fluid that may pass through the heat pipes 490 to reach the exterior heatsink 495 during use.

The perpendicular orientation portion of the heat pipes 490 and the planar orientation of the fins of the exterior heatsink 495 in relation to the longitudinal dimension of the rotating shaft permit convective cooling of the generator 400 when the rotating shaft is not rotating. While airflow through holes into and out of the exterior housing 460 may be provided, the exterior housing 460 also may be isolated from the high velocity airstream. In this way, the generator 400 may be primarily cooled via the heat pipes 490 and exterior heatsinks 495. Thus, the generator 400 is primarily cooled through indirect convection with the liquid moving through the heat dissipation heatsink.

While not required, the contact between the generator 400 and the rotating shaft may be configured to allow heat from the exterior housing 460 to transfer by conduction into the rotating shaft. This conduction heat rejection pathway from the exterior housing 460 into the rotating shaft is the opposite to how many conventional "waste heat" recovery thermoelectric generators operate, where the heat they use to generate electricity is primarily provided through conduction. This rotating shaft conduction pathway may be the only non-fluid regulated cooling of the generator 400.

Preferably, the fluid used transfer heat from heat dissipation heatsink to the exterior heatsink 495 by way of the heat pipes 490, thus the working-fluid, undergoes a phase change during heating and subsequent cooling. Thus, when the working-fluid contacts and cools the heat dissipation heatsink, the working-fluid may vaporize, pass through the heat pipes 490, and then condense to a liquid in the exterior heatsink 495 as heat is released to the exterior heatsink 495. Furthermore, as the generator 400 is configured to operate when affixed to the rotating shaft, the centrifugal forces generated by the rotating shaft may be used to force the working-fluid through the heat pipes 490 when the heat pipes 490 are configured to take advantage of the available centrifugal forces.

The mechanical design of the heat dissipation heatsink also may be configured to take advantage of the centrifugal force to evenly spread the working-fluid against its area, especially the area of the heat dissipation heatsink contacting the heat transfer plate. While the term "heat pipe" is used, the heat pipes 490 are not required to have a round cross-section. The cross-section of the heat pipes 490 may be circular, but also may be ovaloid, rectangular, square, or other convenient shape. Preferably, the cross-section of the heat pipes 490 is rectangular to assist movement of the working-fluid by centrifugal forces.

Figure 4C:
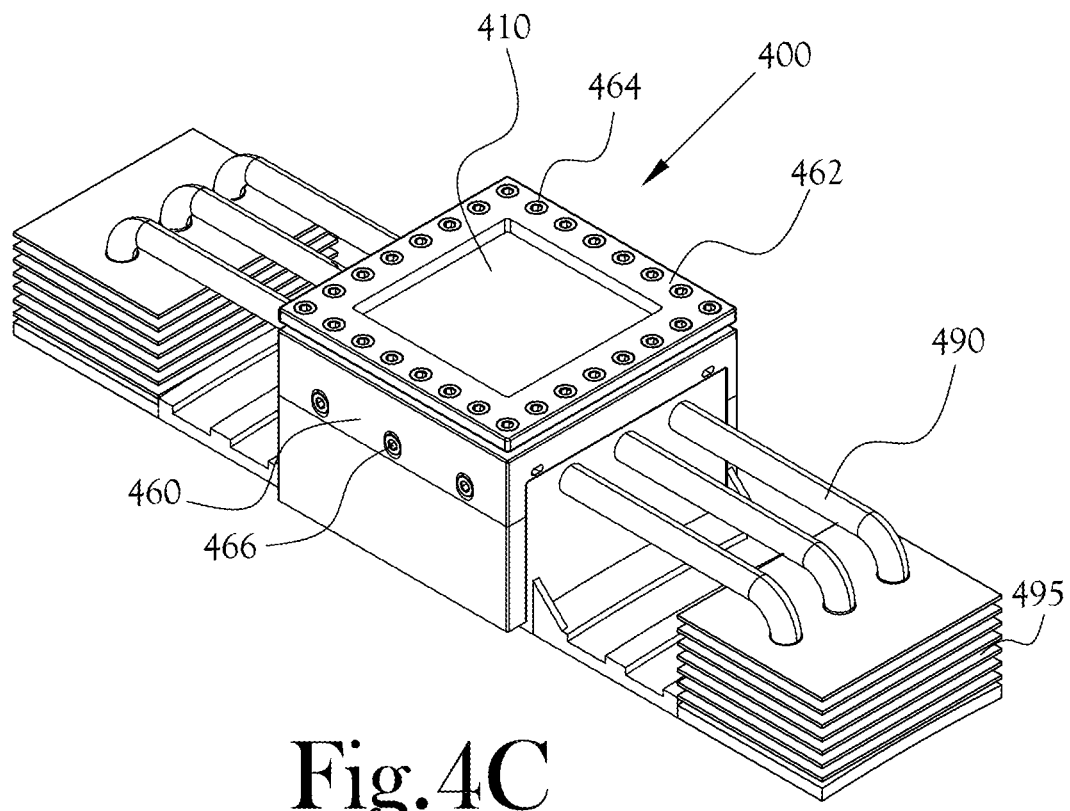
FIG. 4C and FIG. 4D represent a heat pipe, thus liquid and air-cooled generator where the controlled convective cooling system including the heat pipes is optimized for use in a high centrifugal force environment.
Figure 4D:
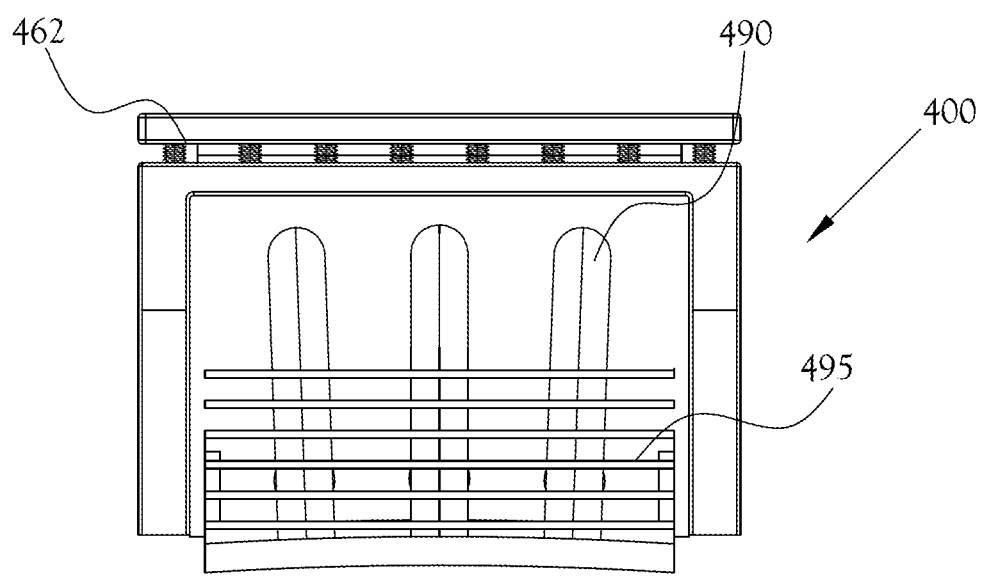

FIG. 4C and FIG. 4D represent a heat pipe, thus liquid and air-cooled generator 400 where the controlled indirect convection cooling system including the heat pipes 490 is optimized for use in a high centrifugal force environment. In relation to the generator 400 of FIG. 4A and FIG. 4B, the generator 400 of FIGS. 4C and 4D has the initial bends in the heat pipes 490 between the exterior housing 460 and the exterior heatsink 495 removed. In this way, the likelihood is reduced of high centrifugal forces preventing the working-fluid from traveling in liquid form between the heat dissipation heatsink and the exterior heatsink 495.

Figure 4E:
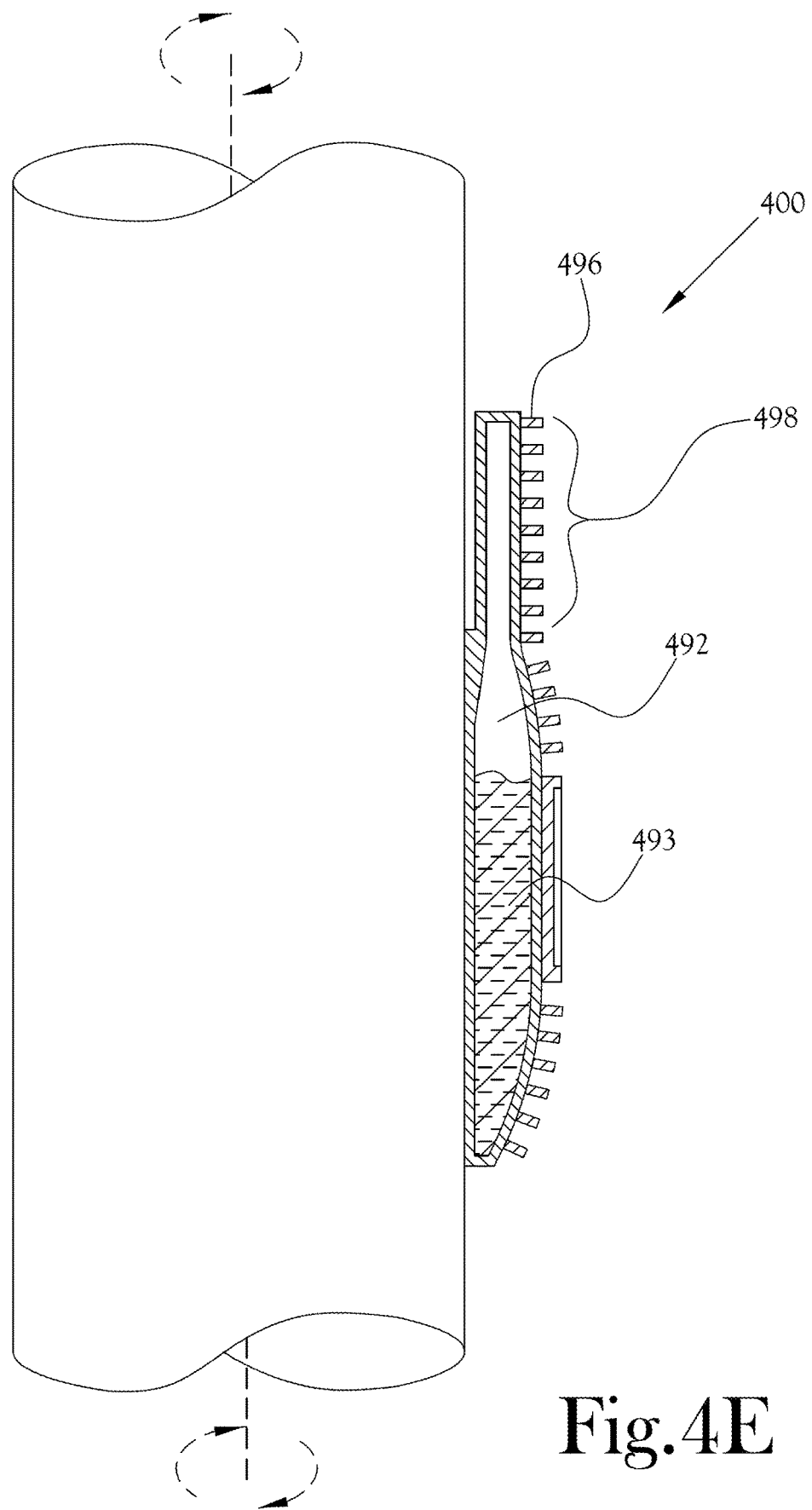
FIG. 4E represents a solid-to-liquid phase, thus solid to liquid and air-cooled TEG.

FIG. 4E represents a solid-to-liquid (STL) phase, thus solid to liquid and then air cooled TEG 400. The generator 400 is configured for attachment to a rotating shaft, but could be used independently of the shaft if placed in a suitable airflow. In this generator 400, the heat pipes and exterior heatsinks are replaced with a solid/liquid containment area 492 that holds a solid 493 that undergoes a phase change to a liquid when heated. The solid/liquid containment area 492 includes exterior heatsink surfaces 496 that assist in convectively transferring heat from the liquid phase STL composition to the air, whether operating in the presence of a high velocity airstream or while the rotating shaft is stationary.

The exterior housing 460 is in conductive thermal communication with the solid/liquid containment area 492 to transfer heat from the heat dissipation heatsink (not shown) to the solid/liquid containment area 492. Preferably, the solid/liquid containment area 492 has a wider cross-section where contacted by the exterior housing 460 than at a vertical end 498. Thus, the vertical end 498 of the solid/liquid containment area 492 provides less internal volume to the phase changing, heated liquid. The vertical end 498 is accessed by the liquid phase STL composition after being heated to the point of solid to liquid phase change and when enough centrifugal force is exerted against the generator 400 that the heated liquid is forced into the vertical end 498. Thus, the generator 400 of FIG. 4E is primarily cooled through indirect convection with a liquid; however, the initial cooling of the generator 400 occurs through conductive cooling with the solid residing within the solid/liquid containment area 492.

Figure 5:
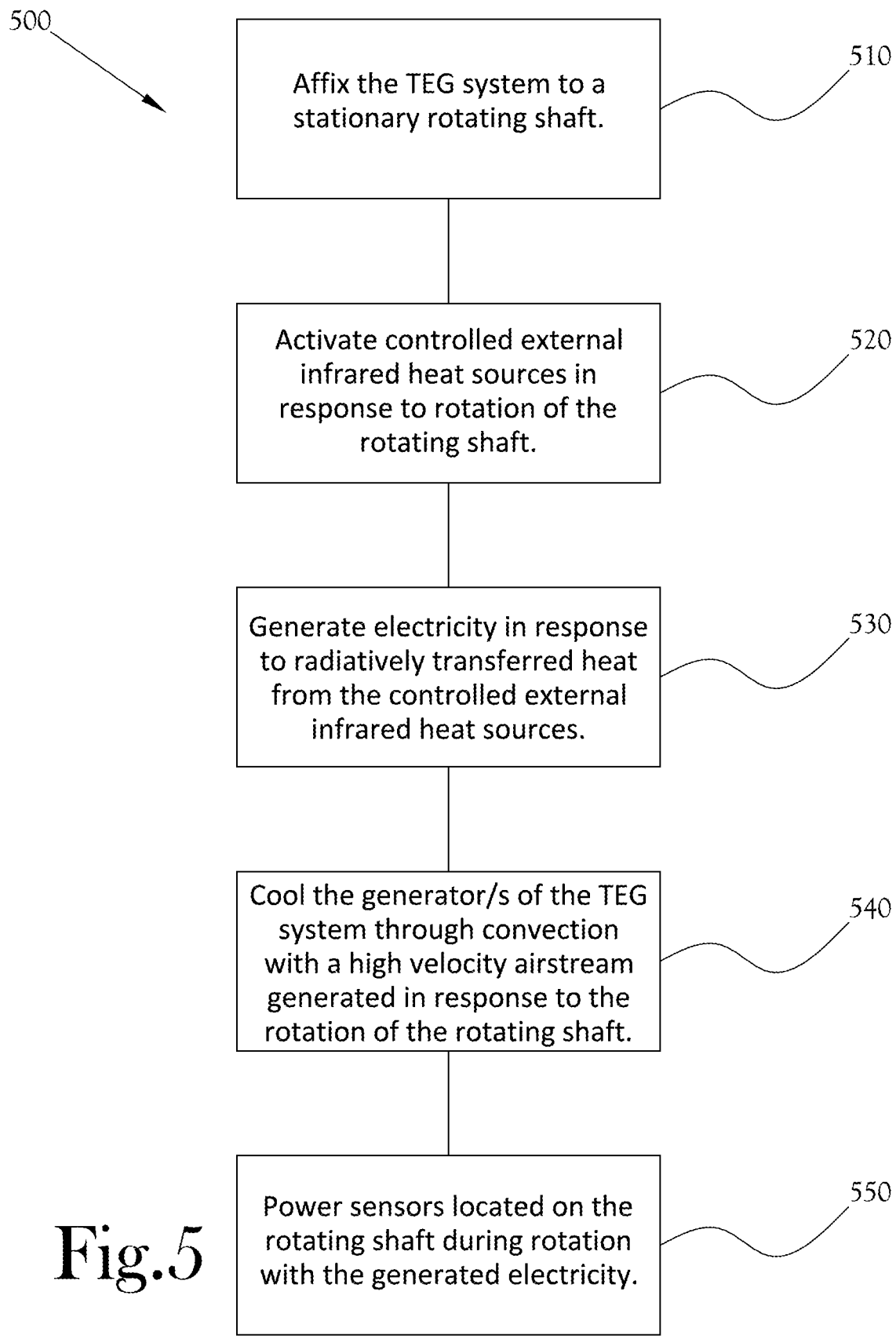
FIG. 5 represents a method of operating the TEG system in response to a rotating shaft.

FIG. 5 represents a method 500 of operating the TEG system in response to a rotating shaft. In 510 the TEG system is affixed to the rotating shaft while the shaft is stationary. In 520, at least one microprocessor activates the controlled external radiant sources in response to the rotation state of the rotating shaft. Preferably, the microprocessor activates the controlled external radiant sources in response to rotating shaft rotation speed and temperature sensors. The temperature sensors may be configured to determine ambient temperature and/or the temperature of the generator/s of the TEG system. In 530, the TEG system generates electricity in response to radiatively transferred heat originating from the controlled external radiant sources. In 540, the thermoelectric generator or generators is cooled through convection with a high velocity airstream generated in response to the rotation of the shaft. Optionally, the heat from the thermoelectric generator or generators is convectively transferred to a working-fluid before being transferred to the high velocity airstream. Optionally, the heat from the thermoelectric generator or generators is conductively transferred to a solid that undergoes a phase change to a liquid before being transferred to the high velocity airstream. In 550, the electricity generated from the TEG system is used to power one or more sensors located on the rotating shaft during rotation of the shaft.

To provide a clear and more consistent understanding of the specification and claims of this application, the following definitions are provided.

Conduction is the transfer of heat through contact with a solid.

Convection is the transfer of heat through the movement of a contacted fluid.

Radiation is the transfer of energy without the need of an intervening medium to carry the energy. Thus, unlike conduction, which requires contact with a solid or convection which requires contact with a moving fluid, energy may be radiatively transferred through a vacuum. Radiative energy transfer involves the emission of energy where the energy travels directly to its point of absorption at the speed of light. Heat may be radiatively transferred, but so may energy such as microwaves, which are not formally heat, but generate heat when striking a suitable material.

Note that spatially relative terms, such as "up," "down," "right," "left," "beneath," "below," "lower," "above," "upper" and the like, may be used for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below in relation to another element or feature. The device may be otherwise oriented (rotated 90 degrees or at other orientations) and the spatially relative descriptors used herein interpreted accordingly.

The simplified diagrams and drawings do not illustrate all the various connections and assemblies of the various components, however, those skilled in the art will understand how to implement such connections and assemblies, based on the illustrated components, figures, and descriptions provided herein, using sound engineering judgment.

While various aspects of the invention are described, it will be apparent to those of ordinary skill in the art that other embodiments and implementations are possible within the scope of the invention. Accordingly, the invention is not to be restricted except in light of the attached claims and their equivalents.

The invention claimed is:

1. A method of converting radiatively transmitted energy to electricity on a rotating shaft with a thermoelectric generation system, the method comprising:
   activating a controlled external radiant source in response to rotation of a rotating shaft;
   generating electricity on the rotating shaft from at least one thermoelectric generator affixed to the rotating shaft;
   cooling the at least one thermoelectric generator through convection; and
   electrically powering one or more sensors on the rotating shaft during rotation of the rotating shaft with the electricity generated from the at least one thermoelectric generator,
   where the at least one thermoelectric generator affixed to the rotating shaft comprises:
      an energy receiving and heat containment window, where the energy receiving and heat containment window comprises an outer plate and an inner heat transfer plate which form an interior space between the outer plate and the inner heat transfer plate;
      an energy conversion system in conductive thermal communication with the energy receiving and heat containment window;
      a heat dissipation heatsink in conductive thermal communication with the energy conversion system; and
      a controlled convection cooling system in convection thermal communication with the heat dissipation heatsink.

2. The method of claim 1, where the activating the controlled external radiant source is performed by at least one processor in response to rotation speed and temperature sensors.

3. The method of claim 1, further comprising cooling the at least one thermoelectric generator by transferring heat through a working-fluid before transferring the heat to a high velocity airstream.

4. The method of claim 1, where the at least one thermoelectric generator conductively transfers heat into the rotating shaft.

5. The method of claim 1, further comprising a rubber like gasket between the outer plate and the inner heat transfer plate where the interior space contains a vacuum.

6. The method of claim 1, where a top interior face of the inner heat transfer plate is coated with a high emissivity coating to enhance adsorption of radiant energy.

7. The method of claim 1, where the outer plate comprises at least one internal passageway.

8. The method of claim 1, where the at least one thermoelectric generator includes at least two thermoelectric generators, where the at least two thermoelectric generators are electrically connected with a positive polarity rail and a negative polarity rail.

9. The method of claim 1, where the heat dissipation heatsink comprises a magnet configured to permit attachment of the generator to a rotating shaft.

10. The method of claim 1, further comprising circulating air through passageways in the outer plate.

11. The method of claim 1, further comprising cooling the heat dissipation heatsink by direct convection cooling.

12. The method of claim 1, where the controlled convection cooling system includes a solid/liquid containment area comprising a solid configured to undergo a phase change to a liquid during operation of the generator, where the solid/liquid containment area comprises exterior heatsink surfaces configured to assist in convectively transferring heat from a liquified solid to stationary or high velocity air, and where the solid/liquid containment area is in conductive thermal communication with the heat dissipation heatsink.

13. The method of claim 1, where the cooling the at least one thermoelectric generator through convection includes cooling through convection with a high velocity airstream, where the high velocity airstream is generated in response to rotation of the rotating shaft.

14. The method of claim 1, where a top face of the outer plate is coated with an anti-reflective coating and a bottom face of the outer plate is coated with a reflective coating, where the anti-reflective coating and the reflective coating are configured to redirect radiant energy striking the bottom face to the inner heat transfer plate.

15. The method of claim 14, where the reflective coating is chosen from metal-based coatings.

16. The method of claim 14, where the anti-reflective coating is chosen from dye-based, laser-deposited, and combinations of such coatings and the reflective coating is chosen from metal-based coatings.

17. The method of claim 1, where the outer plate is formed of high transmissivity glass.

18. The method of claim 17, where the high transmissivity glass is chosen from germanium glass, potassium bromide glass, sodium chloride glass, magnesium fluoride glass, calcium fluoride glass, zinc sulfide glass, zinc selenide glass, sapphire glass, and combinations thereof.

19. The method of claim 1, where the radiatively transmitted energy is generated from a controlled external radiant source.

20. The method of claim 19, where the controlled external radiant source is chosen from laser beam(s), infrared heater (s), flame(s) from burner(s), concentrated solar energy, ceramic heaters, carbon heaters, quartz lamps, and other radiant energy sources.

21. The method of claim 19, where the radiatively transmitted energy is concentrated toward the energy receiving and heat containment window.

22. The method of claim 1, where an exterior housing comprising a face plate encases the energy receiving and heat containment window, the energy conversion system, and the heat dissipation heatsink.

23. The method of claim 22, further comprising a high-temperature compatible O-ring between the face plate and the outer plate.

24. The method of claim 22, where the face plate further comprises face plate holes configured to allow air to circulate around the energy receiving and heat containment window.

25. The method of claim 22, where the controlled convection cooling system includes an induction funnel configured to force high velocity air into the exterior housing, where the induction funnel includes an inlet in air communication with the high velocity air and an outlet in air communication with the heat dissipation heatsink.

26. The method of claim 25, where the induction funnel comprises a height dimension that is at least four times a width dimension.

27. The method of claim 25, where the induction funnel comprises a tapered side opposite the inlet.

28. The method of claim 25, where the exterior housing comprises opening vents on a side opposite the induction funnel outlet, where the opening vents are in air communication with the heat dissipation heatsink.

29. The method of claim 22, where the controlled convection cooling system includes heat pipes that terminate in at least one exterior heatsink.

30. The method of claim 29, where the heat pipes comprise a portion that is perpendicularly oriented to a longitudinal dimension of the rotating shaft and the at least one exterior heatsink comprises fins planarly oriented to the longitudinal dimension of the rotating shaft.

31. The method of claim 29, where the heat pipes contain a working-fluid that undergoes a phase change from a liquid phase to a vapor phase during operation of the generator.

32. The method of claim 31, where a conversion of the working-fluid from the liquid phase to the vapor phase occurs within the exterior housing and a conversion of the working-fluid from the vapor phase to the liquid phase occurs within a portion of the heat pipes in conductive thermal communication with the at least one exterior heatsink.

* * * * *